United States Patent [19]

Kunitoki et al.

[11] Patent Number: 4,827,161
[45] Date of Patent: May 2, 1989

[54] COMPARATOR HAVING AN OFFSET VOLTAGE CANCELLATION CIRCUIT

[75] Inventors: Tadayoshi Kunitoki, Sakaide; Akihiko Itoh, Kawasaki, both of Japan

[73] Assignee: Fujitsu Limited, Kawasaki, Japan

[21] Appl. No.: 60,019

[22] Filed: Jun. 9, 1987

[30] Foreign Application Priority Data

Jun. 11, 1986 [JP] Japan ................... 61-133790

[51] Int. Cl.⁴ .................. H03K 5/24; H03K 5/153
[52] U.S. Cl. ................. 307/491; 307/362; 307/494
[58] Field of Search ........... 307/491, 494, 355, 362; 328/128; 330/9, 280, 299, 289, 100

[56] References Cited

U.S. PATENT DOCUMENTS 4,377,759 3/1983 Ohhata et al. .................. 328/128
4,623,854 11/1986 Kuraishi .......................... 330/9

Primary Examiner—John Zazworsky
Attorney, Agent, or Firm—Staas & Halsey

[57] ABSTRACT

A comparator using an operational amplifier, includes an input switching circuit for passing an input signal in a first state wherein a comparison is effected and for stopping the input signal in a second state wherein an input offset voltage is cancelled. An output switching circuit holds an output signal in the first state and outputs a held output signal in the second state of the input switching circuit. An input/output switching signal generation circuit generates control signals to switch between the first state and the second states; and a first comparator outputs resultant comparison data in the first state and cancels the input offset voltage in the second state.

9 Claims, 6 Drawing Sheets

COMPARATOR HAVING AN OFFSET VOLTAGE CANCELLATION CIRCUIT

BACKGROUND OF THE INVENTION

1. Field of the Invention

The present invention relates to a comparator using an operational amplifier, more particularly, it relates to a comparator circuit enabling switching between one state wherein a comparison is effected and another state wherein an input offset voltage is canceled, thus making it possible to obtain a precise comparison output voltage not affected by an input offset voltage of the operational amplifier.

2. Description of the Related Art

In the comparator using the operational amplifier, it is well known that decision level errors in a reference voltage used for comparison with the input signal are caused by the input offset voltage. The input offset voltage is that occurring when input terminals of the comparator are shorted together and a small voltage remains in an internal circuit of the comparator. Such an input offset voltage is caused by a dispersion of electrical characteristics of the circuit elements, for example, FET transistors, resistors and the like, in the comparator and by a temperature drift of the above circuit elements. When decision level errors are caused by the input offset voltage, a precise comparison output voltage can not be obtained from the comparator.

Conventionally, there have been attempts to reduce or cancel the dispersion of values of the circuit elements, as countermeasures against the input offset voltage. Such countermeasures, however, are not satisfactory because it is difficult to mass-produce precise circuit elements without dispersion of the electrical characteristic. Moreover, it is necessary to provide an external clock generator for generating a clock signal to control an offset voltage cancellation circuit. In this case, it is also necessary to change the frequency of the clock signal when the frequency of an input signal is changed, in order to carry out the offset voltage cancellation over a constant period.

SUMMARY OF THE INVENTION

The primary object of the present invention is to provide a comparator enabling a generation of a precise comparison output voltage that is not affected by an input offset voltage.

Another object of the present invention is to provide a comparator in which the clock signal for controlling the offset voltage cancellation circuit can be generated in the comparator itself, based on the input signal to be compared, thus making it unnecessary to supply the clock signal from the external clock generator.

Still another object of the present invention is to provide a comparator which can prevent instability of an output voltage of the comparator during the offset cancelling operation.

In accordance with the present invention, there is provided a comparator using an operational amplifier including: an input switching circuit for passing an input signal in one state wherein a comparison is effected and for cutting the input signal in another state wherein an input offset voltage is canceled, in the comparator; an output switching circuit for holding an output signal in one state and for outputting a held output signal in the other state of the input switching circuit; an input/output switching signal generation circuit connected to the input and output switching circuit for generating control signals in response to the input signal to switch between one state and the other state, and a first comparator for outputting resultant data of the comparison in one state and for canceling the input offset voltage in the other state.

DESCRIPTION OF THE PREFERRED EMBODIMENTS

A comparator according to an embodiment of the present invention will be explained in detail with reference to the accompanying drawings.

Figure 1:
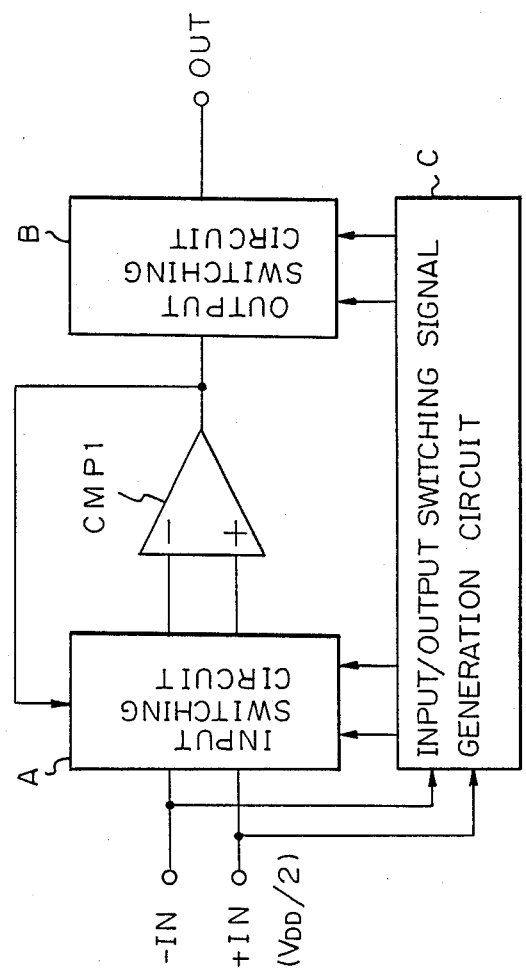
FIG. 1 is a block diagram of a comparator according to an embodiment of the present invention.

In FIG. 1, the comparator comprises an input switching circuit A, an output switching circuit B, an input/output switching signal generation circuit C, and a first comparator CMP1. A minus side input terminal ($-IN$) is used for inputting an input signal to be compared, and a plus side input terminal ($+IN$) for inputting a reference voltage, which is usually a half of a power source voltage $V_{DD}$. The input switching circuit A can pass or cut the input signal by control of the circuit C in accordance with the comparison of the input signal or the cancellation of the input offset voltage. The output switching circuit B can hold the output signal in the comparison state and can switch gates provided therein so as to output the signal from the holding circuit during a cancellation of input offset voltage. The input/output switching signal generation circuit C generates switching signals for control of the above circuits A and B. The first comparator CMP1 can function in two states, i.e., the input signal comparison state and the input offset voltage cancellation state, as explained in detail hereinafter.

Figure 2:
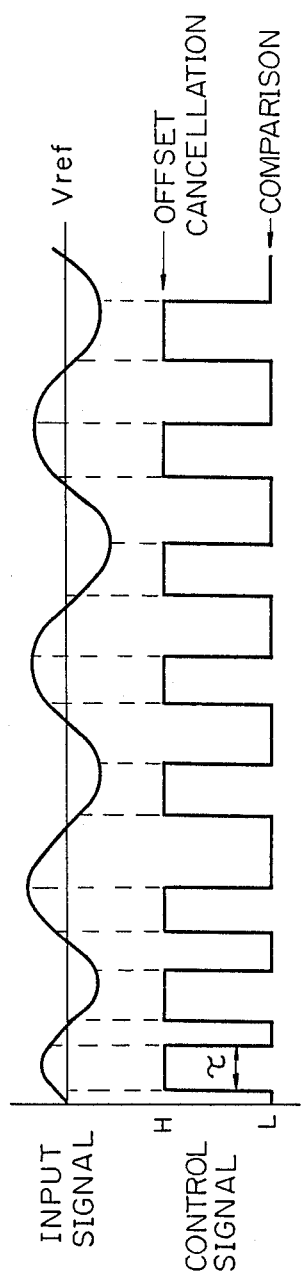
FIG. 2 is a signal timing chart for explaining relationships among an input signal waveform, an input offset voltage cancellation period, and a comparison period, according to the present invention.

In FIG. 2, when the control signal as a clock signal is high level, the period $\tau$ denotes a cancellation period, and when the control signal is low level, this period denotes a comparison period. In this case, the period $\tau$ is determined by a maximum input frequency in such a way that the relationship between the period $\tau$ and the maximum input frequency $f_{max}$ (Hz) is given by $\tau < \frac{1}{2} \cdot f_{max}$. Accordingly, the period $\tau$ is determined from the maximum frequency thereof based on the above formula. Therefore, the input offset voltage cancellation is performed during this high level period, and the comparison is performed during the low level period of the control signal. As shown by the dotted lines, the comparison period is defined by a changed portion of the polarity of the input signal based on the reference voltage $V_{ref}$, and the cancellation period is defined by a non-changed portion of the polarity of the input signal. In the comparison period, the output of the comparator is switched from the high level to the low level or from the low level to the high level in response to the input signal. At the same time, the output of the first comparator CMP1 is held to the high level or the low level in the output holding circuit. Therefore, in the present invention, a comparison is performed only when the polarity of the input signal is changed, and the output of the comparator CMP1 is held at the high or low level in the output holding circuit in correspondence with a previous level. Accordingly, even if decision level errors occur due to the input offset voltage, since the comparison is performed during the comparison period, the input offset voltage does not affect the resultant comparison data.

Figure 3:
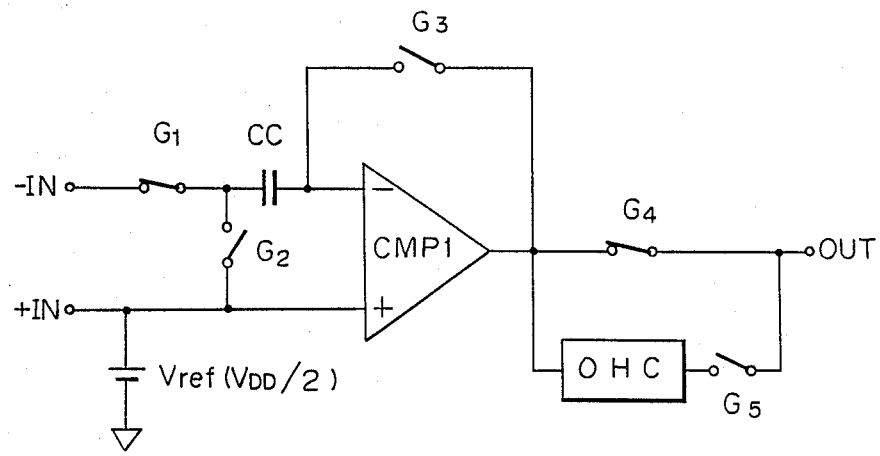
FIG. 3 is a basic block diagram for explaining a comparison function of the comparator shown in FIG. 1.
Figure 4:
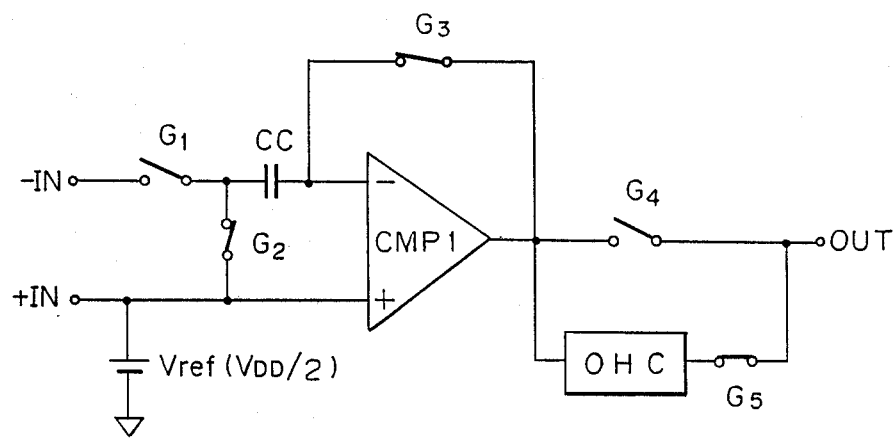
FIG. 4 is a basic block diagram for explaining a cancellation function of the input offset voltage of the comparator shown in FIG. 1.

In FIGS. 3 and 4, these circuits represent one state wherein the comparison is effected (FIG. 3) and the other state wherein the input offset voltage is canceled (FIG. 4). In these drawings, gates (transistor switches) $G_1$ to $G_3$ are provided in the input switching circuit A shown in FIG. 1 and gates $G_4$ and $G_5$ are provided in the output switching circuit B. These gates $G_1$ to $G_5$ are controlled by the input/output switching signal generation circuit C. OHC is an output holding circuit provided in the circuit B. The output holding circuit holds resultant comparison data and outputs this data to the output terminal during a cancellation period.

In the comparison shown in FIG. 3, the gates $G_1$ and $G_4$ are ON and the gates $G_2$, $G_3$ and $G_5$ are OFF. Therefore, the input signal ($-IN$) is compared with the reference voltage $V_{ref}$ so that the high or low level output is obtained from the output terminal. Simultaneously, this high or low level signal is held in the output holding circuit OHC.

In the cancellation shown in FIG. 4, the gates $G_2$, $G_3$ and $G_5$ are ON, and the gates $G_1$ and $G_4$ are OFF. Accordingly, the input terminals of the comparator CMP1 are shorted together since the gate $G_2$ is ON, and the feedback loop is formed because the gate $G_3$ is ON. The input offset voltage can be canceled by holding the input offset voltage in the capacitor CC. Since the gate $G_5$ is ON, the comparison data held in the OHC is output through the gate $G_5$ during this state so that the comparator CMP1 is not output in the cancellation period.

Figure 5:
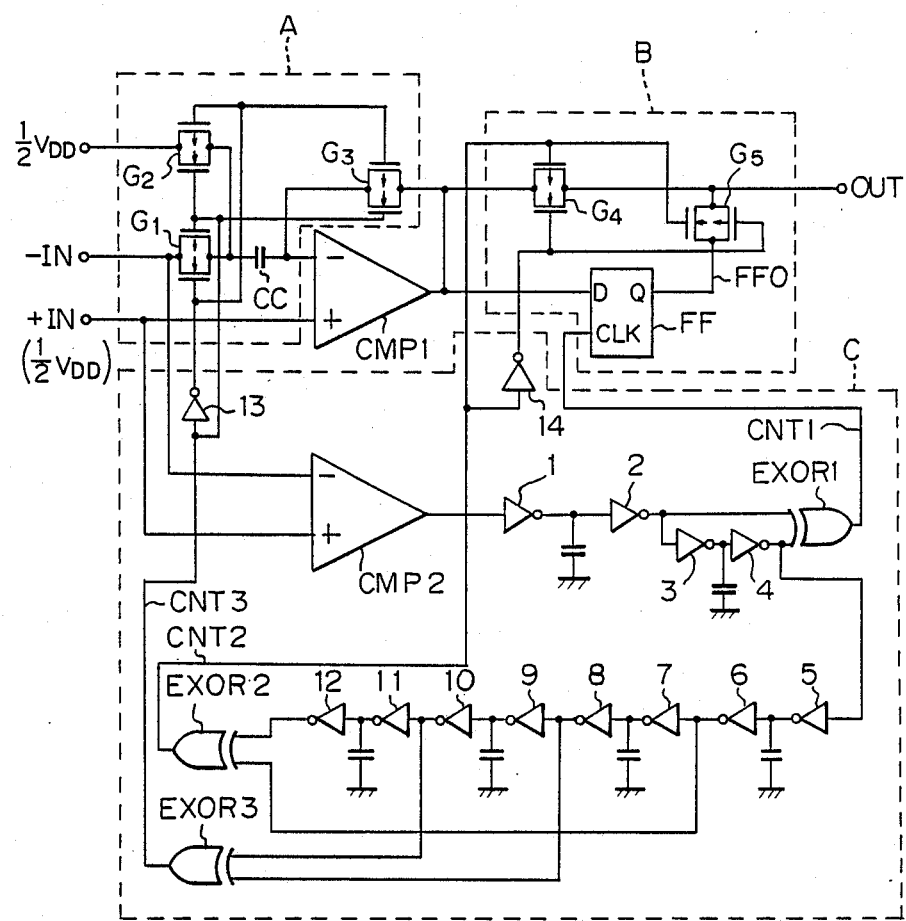
FIG. 5 is a detailed circuit diagram of the comparator shown in FIG. 1.

In FIG. 5, the input switching circuit A comprises three gates $G_1$ to $G_3$ and a capacitor CC. Each gate is constituted by a pair of a P-channel MOS (PMOS) transistor and an N-channel MOS (NMOS) transistor. As is known, the PMOS transistor can be turned ON when the gate is low level, and the NMOS transistor can be turned ON when the gate is high level. Therefore, the ON or OFF state of each gate is controlled by the high or low level signal applied from the circuit C to each gate. As explained above, the capacitor CC holds the input offset voltage.

The output switching circuit B comprises two gates $G_4$ and $G_5$ each having a PMOS and an NMOS transistor, and a flip-flop circuit FF used as the output holding circuit OHC. FFO is an output signal of the circuit OHC.

The input/output switching signal generation circuit C comprises a second comparator CMP2 for outputting a high or low level signal to generate control signals in response to a change in the input signal, three exclusive OR gates EXOR1 to EXOR3 each outputting control signals CNT1 to CNT3, and a plurality of inverters 1 to 14 and capacitors for inverting the control signal and for obtaining a delay time at each capacitor.

The operation of this circuit will be explained with reference to FIG. 6. As explained in FIGS. 3 and 4, in the comparison function the gates $G_1$ and $G_4$ are ON, and the gates $G_2$, $G_3$ and $G_5$ are OFF. In order to obtain the above states, the control signals CNT2 and CNT3 are set to the low level during times $T_{b1}$ and $T_{b2}$. The output signal OUT is switched from the low level to the high level during time $T_{b1}$, and from the high level to the low level during time $T_{b2}$. In this case, when the control signal CNT2 is low level, the PMOS of the gate $G_4$ is turned ON and the PMOS of the gate $G_5$ is turned OFF. Simultaneously, since the inverted control signal of the CNT2 is input to the NMOS of the gates $G_4$ and $G_5$ through the inverter 14, the gate $G_4$ is turned ON and the gate $G_5$ is turned OFF. Moreover, when the control signal CNT3 is low level, the gate $G_1$ is turned ON, and the gates $G_2$ and $G_3$ are turned OFF. These low levels of the control signals CNT2 and CNT3 are obtained from the exclusive OR gates EXOR2 and EXOR3.

In the cancellation period, the gates $G_1$ and $G_4$ are OFF and the gates $G_2$, $G_3$ and $G_5$ are ON. In order to obtain the above states, the control signals CNT2 and CNT3 are set to the high level during times $T_{a1}$ and $T_{a2}$. During these times $T_{a1}$ and $T_{a2}$, the output signal OUT is held to the low level during time $T_{a1}$ or to the high level during time $T_{a2}$. In this case, since the output of the first comparator CMP1 is fed back to the inverted input side (minus side), the output of the first comparator CMP1 becomes a half of the power source voltage $V_{DD}$. Moreover, since the control signal CNT1 from the exclusive OR gate EXOR1 to a clock terminal of the flip-flop circuit FF is held low, the data held in the flip-flop FF is output to the output terminal OUT through the gate $G_5$ in the cancellation period. This output signal FFO is similar to the low level signal during the time $T_{a1}$ and to the high level signal during the time $T_{a2}$, at the output signal OUT.

Figure 7:
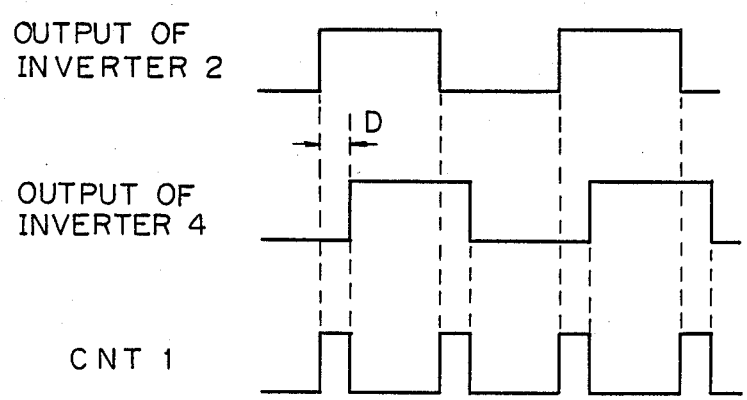
FIG. 7 is a timing chart for explaining the generation of the control signal CNT1.

In the input/output switching signal generation circuit C, the control signal CNT1 is obtained from the outputs of the inverters 2 and 4 as shown in FIG. 7. That is, the output of the inverter 2 is input to the EXOR1 and the delayed output of the inverter 4 is also input to the EXOR1. In this case, the output of the inverter 2 is high level and that of the inverter 4 is low level during this delay time D. Therefore, the output of the EXOR1 becomes high level during this delay time D. That is, the control signal CNT1 can be obtained from the EXOR1.

Moreover, the output of the inverter 4 is input to the inverter 5. Regarding the control signals CNT2 and CNT3, the output signal of the inverter 4 is delayed through the pairs of inverters 5 and 6, 7 and 8, 9 and 10, and 11 and 12. In this case, the delayed output signal of the inverter 6 and the other delayed output signal of the inverter 12 are input to the EXOR2, and the output of the inverter 8 and the output of the inverter 10 are input to the EXOR3. Therefore, with both inputs of each exclusive OR circuit EXOR2 and EXOR3 at high or low level, the output of the exclusive OR gate becomes low level, and when any one input is high or low level and another input is at an opposite level, the output becomes high level.

Figure 6:
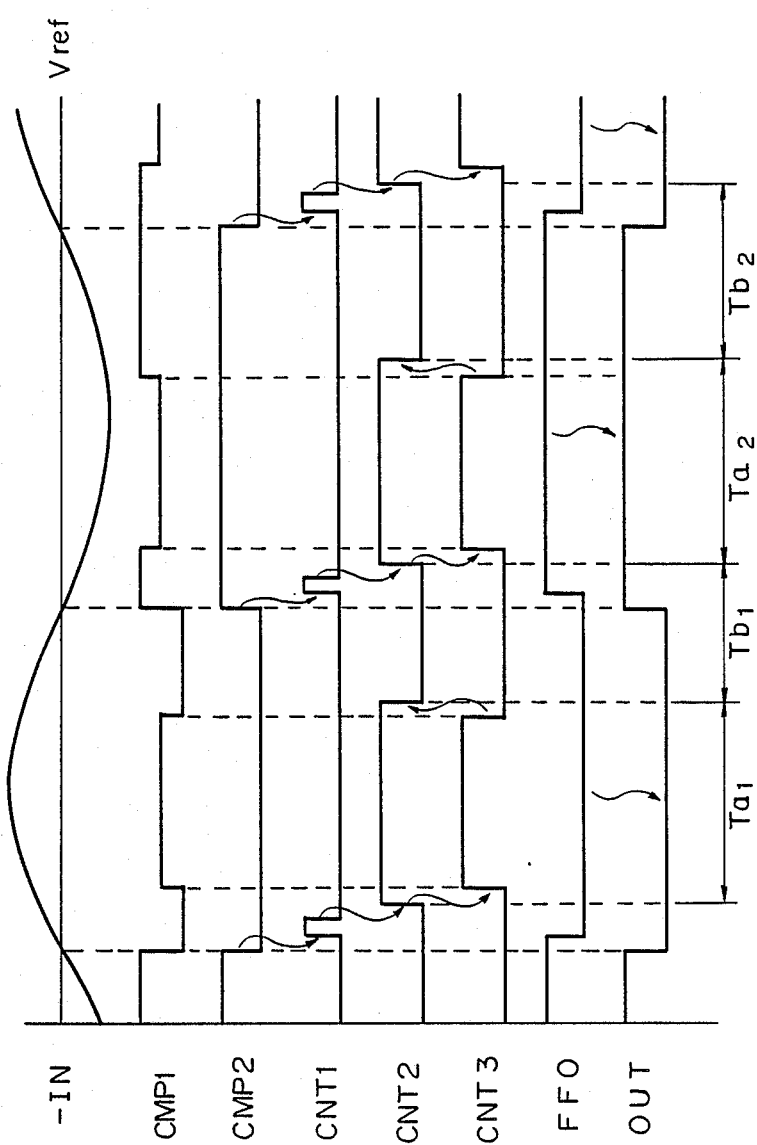
FIG. 6 is a signal timing chart of each point of the comparator shown in FIG. 5.

In this case, as shown by arrow lines in FIG. 6, the change from high level to low level or from low level to high level is performed in correspondence with the leading edge or trailing edge of the second comparator CMP2. That is, based on the trailing edge and the leading edge of the comparator CMP2, the signals CNT1, CNT2 and CNT3 are changed from low level to high level. Therefore, when the control signal CNT2 is changed from low level to high level, the control signal CNT3 is also changed from low level to high level after a short delay. When the control signal CNT3 is changed from high level to low level, the control signal CNT2 is also changed from high level to low level after a short delay.

As explained above, in the present invention, the change of the input signal ($-IN$) is detected, the control signals CNT1 to 3 are generated, and the output of the comparator CMP1 is held in the output holding circuit. The offset cancellation state is then automatically realized during a predetermined period, and returns to the comparison state. Therefore, it is not necessary to provide the clock signal supplied from the external clock generator in order to cancel the offset voltage.

We claim:

1. A comparator using an operational amplifier comprising:

input switching means for passing a first input signal in a first state wherein a comparison is effected and for stopping said first input signal in a second state wherein an input offset voltage is canceled, in said comparator;

output switching means for holding an output signal in said first state and for outputting a held output signal in said second state of said input switching means;

first comparator means connected to said input and output switching means for comparing said first input signal with a second input signal and for outputting resultant comparison data in said first state and for canceling said input offset voltage in said second state; and input/output switching signal generation means connected to said input and output switching means for generating control signals to switch between said first state and said second state in such a way that said first input signal is compared with said second input signal when the amplitude of said first input signal goes above or below the amplitude of said second input signal.

2. A comparator as claimed in claim 1, wherein said input switching means comprises three transistor gates for passing or stopping said first input signal and a capacitor for holding said input offset voltage.

3. A comparator as claimed in claim 1, wherein said output switching means comprises two transistor gates for switching between said first state and said second state, and an output holding circuit for holding said output signal in said first state.

4. A comparator as claimed in claim 1, wherein said input/output switching signal generation means comprises second comparator means for generating said control signals, three exclusive OR gates for outputting said control signals, and a plurality of inverters and capacitors for delaying said control signals.

5. A comparator as claimed in claim 1, wherein said first state wherein the comparison is effected is applied when a polarity of said first input signal is changed based on a reference voltage.

6. A comparator as claimed in claim 1, wherein said second state wherein the input offset voltage is canceled is applied when said polarity of a first input signal is not changed based on a reference voltage.

7. A comparator as claimed in claim 1, wherein a period $\tau$ of said second state wherein the input offset voltage is canceled is determined by a maximum input frequency $f_{max}$.

8. A comparator as claimed in claim 7, wherein a relationship between said period $\tau$ and said maximum input frequency $f_{max}$ is given by $\tau < \frac{1}{2} \cdot f_{max}$.

9. A comparator as claimed in claim 5, wherein said second state wherein the input offset voltage is canceled is applied when the polarity of said first input signal is not changed based on the reference voltage.

* * * * *

UNITED STATES PATENT AND TRADEMARK OFFICE
CERTIFICATE OF CORRECTION

PATENT NO. : 4,827,161

DATED : MAY 2, 1989

INVENTOR(S) : TADAYOSHI KUNITOKI ET AL.

Page 1 of 2

It is certified that error appears in the above-identified patent and that said Letters Patent is hereby corrected as shown below:

FRONT PAGE, Col. 2, [56] References Cited, please delete this section in its entirety, and in place thereof, insert the following new section:

--[56]    References Cited

U.S. PATENT DOCUMENTS

| | | | |
|---|---|---|---|
| 3,748,587 | 7/1973 | Aumiaux . | |
| 4,297,642 | 10/1981 | Baldwin et al. . | |
| 4,377,759 | 3/1983 | Ohhata et al. | 328/128 |
| 4,577,159 | 3/1986 | Pace . | |
| 4,623,854 | 11/1986 | Kuraishi | 330/9 |

FOREIGN PATENT DOCUMENTS

| | | |
|---|---|---|
| 0150606 | 8/1985 | Europe . |
| 2157108 | 10/1985 | Great Britain . |

OTHER PUBLICATIONS

*Prentice-Hall, Englewood Cliffs,* "Digital Processing of Speech Signals", L. R. Rabiner et al., 1978, pp. 24-26.--.

FRONT PAGE [57] ABSTRACT line 10, "states;" should be --state,--.

UNITED STATES PATENT AND TRADEMARK OFFICE
CERTIFICATE OF CORRECTION

PATENT NO. : 4,827,161

DATED : MAY 2, 1989

INVENTOR(S) : TADAYOSHI KUNITOKI ET AL.

Page 2 of 2

It is certified that error appears in the above-identified patent and that said Letters Patent is hereby corrected as shown below:

Col. 3, line 61, "G5" should be --$G_5$--.

Col. 5, line 19, "CMP1is" should be --CMP1 is--.

Col. 6, line 30, "said" should be --a--;
      line 30, "a" should be --said--.

Signed and Sealed this

Sixteenth Day of January, 1990

*Attest:*

JEFFREY M. SAMUELS

*Attesting Officer*     *Acting Commissioner of Patents and Trademarks*